United States Patent
Voss et al.

(10) Patent No.: US 11,522,542 B2
(45) Date of Patent: Dec. 6, 2022

(54) WIDE BANDGAP OPTICAL SWITCH CIRCUIT BREAKER

(71) Applicant: Lawrence Livermore National Security, LLC, Livermore, CA (US)

(72) Inventors: Lars F. Voss, Livermore, CA (US); Adam M. Conway, Livermore, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 540 days.

(21) Appl. No.: 16/430,021

(22) Filed: Jun. 3, 2019

(65) Prior Publication Data
US 2020/0382118 A1 Dec. 3, 2020

(51) Int. Cl.
| | |
|---|---|
| H01L 27/14 | (2006.01) |
| H03K 17/78 | (2006.01) |
| H01L 31/0288 | (2006.01) |
| H01L 31/09 | (2006.01) |
| H01L 31/0304 | (2006.01) |
| H01L 31/0312 | (2006.01) |

(52) U.S. Cl.
CPC ......... *H03K 17/78* (2013.01); *H01L 31/0288* (2013.01); *H01L 31/03042* (2013.01); *H01L 31/03044* (2013.01); *H01L 31/03125* (2013.01); *H01L 31/09* (2013.01)

(58) Field of Classification Search
CPC .............. H03K 17/78; H01L 31/0288; H01L 31/03042; H01L 31/03044; H01L 31/03125; H01L 31/09
See application file for complete search history.

(56) References Cited

U.S. PATENT DOCUMENTS

| | | | | |
|---|---|---|---|---|
| 4,825,061 | A * | 4/1989 | Schoenbach | H01L 31/02963 250/214.1 |
| 7,608,524 | B2 * | 10/2009 | Gupta | C30B 23/00 257/77 |
| 2007/0292074 | A1 * | 12/2007 | Mazzola | H03K 17/78 385/14 |

OTHER PUBLICATIONS

Chao, J-H., et al., "Ruby fluorescence-enabled ultralong lock-on time high-gain gallium arsenic photoconductive semiconductor switch," Optics Letters, vol. 43, No. 16, Aug. 2018.
(Continued)

*Primary Examiner* — Angelo Trivisonno
(74) *Attorney, Agent, or Firm* — Perkins Coie LLP

(57) ABSTRACT

A high-voltage switch is adapted for use as a medium-voltage direct current circuit breaker, which provides a low-cost, small-footprint device to mitigate system faults. In one example, a method for operating a wideband optical device includes illuminating the wide bandgap optical device with a light within a first range of wavelengths and a first average intensity, allowing a current to propagate therethrough without substantial absorption of the current, illuminating the wide bandgap optical device with light within the first range of wavelengths and a second average intensity that is lower than the first average intensity to allow a sustained current flow though the wide bandgap optical device, and illuminating the wide bandgap optical device with light within a second range of wavelengths to stop or substantially restrict propagation of the current through the wide gap material.

12 Claims, 8 Drawing Sheets

(56) References Cited

OTHER PUBLICATIONS

Hall, D., et al., "Complementary metal-oxide-semiconductor compatible 1060 nm photodetector with ultrahigh gain under low bias," Optics Letters, vol. 40, No. 19, pp. 4440-4443, (2015).

Imtiaz, M., A., et al., "Light Generated Effects on Power Switches used in a Planar PV Power System with Monolithically Embedded Power Converters," IEEE Journal of Photovoltaics, vol. 3, No. 1, Jan. 2013.

Sampayan, E., S., et al., "High voltage wide bandgap photoconductive switching" Materials Science Forum vol. 821, pp. 871-874, (2015).

Voss, F., L., et al., "Blue shift of GaAs micropillars strained with silicon nitride", Appl Phys Lett 103 (21), 212104, (2013).

\* cited by examiner

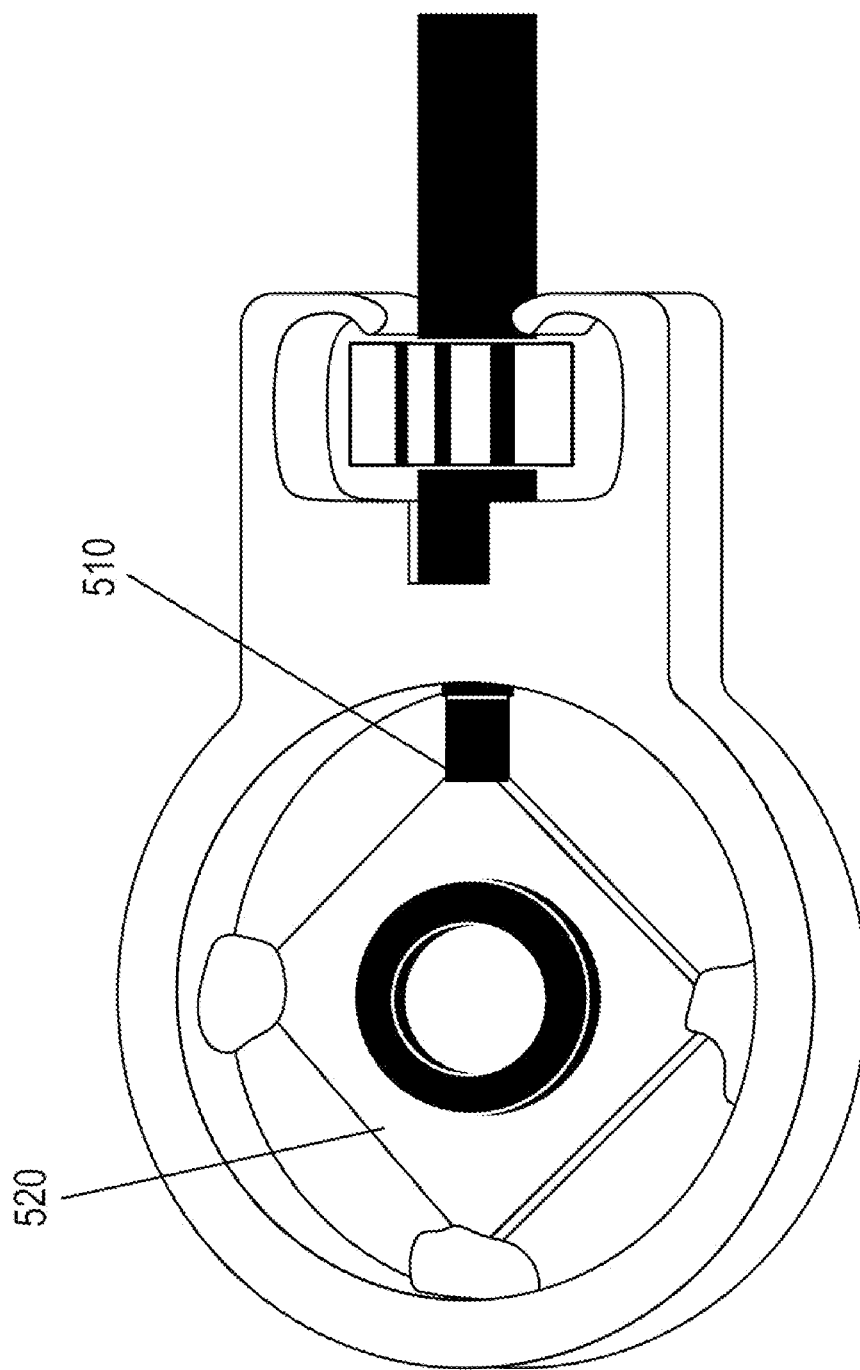

WIDE BANDGAP OPTICAL SWITCH CIRCUIT BREAKER

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This document relates to high-voltage switches and in particular to high voltage switches that are capable of being adapted to function as circuit breakers.

BACKGROUND

Power semiconductor switching devices are integral to modern power electronics converters. The emergence of wide bandgap (WBG) semiconductor devices promises to revolutionize next-generation power electronics converters. WBG devices feature many characteristics, including high breakdown electrical fields and fast switching speeds, which are beneficial for the efficiency, power density and reliability of power electronics converters.

SUMMARY

Disclosed embodiments relate to optical circuit breaker devices, systems and methods that include a wide bandgap optical switch that is configured to operate with light sources of different wavelengths to enable fast opening and closure of electrical circuits. One exemplary circuit breaker device includes a wide bandgap optical switch, a first laser operable at a first wavelength or range of wavelengths, a second laser operable at a second wavelength or range of wavelengths, and a laser controller circuit configured to produce electronic signals for operation of the first laser and the second laser, wherein the first laser is coupled to the laser controller circuit and configured to illuminate the wide bandgap optical switch in response to receiving a first signal from the laser controller and to thereby cause a sustained current to flow through the wide bandgap optical switch and to cause the optical circuit breaker device to close, wherein the second laser is coupled to the laser controller circuit and configured to illuminate the wide bandgap optical switch with light having the second wavelength or range of wavelengths in response to a second signal, and to thereby cause the optical circuit breaker device to open, and wherein the first wavelength or range of wavelengths is different from the second wavelength or range of wavelengths.

In another exemplary aspect, a wide bandgap optical device is disclosed. This device includes a first electrode, a second electrode, and a wide bandgap semiconductor material coupled to a first electrode and to a second electrode and configured to receive light having a first wavelength and second wavelength, the wide bandgap semiconductor material configured to operate in an avalanche mode upon receiving an optical beam having the first wavelength to allow a current to flow through the first electrode, the wide bandgap semiconductor material and the second electrode, and to operate in a current-limiting mode upon receiving light having the second wavelength that is greater than the first wavelength to substantially restrict or stop the current flow in the wide bandgap semiconductor material.

In yet another exemplary aspect, a method of operating a wide bandgap optical device is disclosed. This method includes illuminating the wide bandgap optical device with a light within a first range of wavelengths and a first average intensity, thereby allowing a current to propagate therethrough without substantial absorption of the current, illuminating the wide bandgap optical device with light within the first range of wavelengths and a second average intensity that is lower than the first average intensity to allow a sustained current flow though the wide bandgap optical device, and illuminating the wide bandgap optical device with light within a second range of wavelengths to stop or substantially restrict propagation of the current through the wide gap material.

The above and other aspects and features of the disclosed technology are described in greater detail in the drawings, the description and the claims.

BRIEF DESCRIPTION OF THE DRAWINGS

FIG. 5B illustrates a photograph of a fabricated device of the schematic in FIG. 5A.

DETAILED DESCRIPTION

In this patent document, the word "exemplary" is used to mean serving as an example, instance, or illustration. Any embodiment or design described herein as "exemplary" is not necessarily to be construed as preferred or advantageous over other embodiments or systems. Rather, use of the word exemplary is intended to present concepts in a concrete manner.

Embodiments of the disclosed technology relate to a direct current (DC) circuit breakers that enable a broad range of applications, across a wide span of voltage ranges, by providing a low-cost, small-footprint device to mitigate system faults. This is implemented, for example, by modifying a bulk optical semiconductor switch (BOSS), and in general a wide bandgap (WBG) optical switch, sometimes referred to as WBG BOSS, to enable its operation as an DC circuit breaker.

In some embodiments, the WBG BOSS is based on a high-voltage photoconductive semiconductor switch (PCSS) in SiC, which operates at a voltage (>30 kV) that is an order of magnitude higher than other SiC-based switches, while simultaneously maintaining low on-resistance of subohm. In addition, it is scalable to greater than 100 kV class switching and operates at a much higher speed (sub-nanosecond turn on/off time).

Embodiments of the disclosed technology can, for example, advantageously improve grid reliability and resilience, with applications across several tiers of the system, ranging from utility distribution circuits to power transmission networks, including high-voltage DC (HVDC) and medium voltage DC (MVDC) grids. Among other features, benefits and applications, the embodiments described herein enable fast-acting protective relays at distribution grid voltages that will minimize the response time to isolate a fault, allowing faster service restoration to utility customers and reducing safety hazards while improving resilience and reliability. Fast-acting, reactive power-control devices as well as other flexible AC transmission systems (FACTS) devices will minimize the response time to dynamically produce reactive support to the grid and ensure transmission grid stability. DC breakers implemented in accordance with embodiments of the disclosed technology will protect the high-voltage grid infrastructure from damage by breaking the high-fault currents.

Figure 1A:
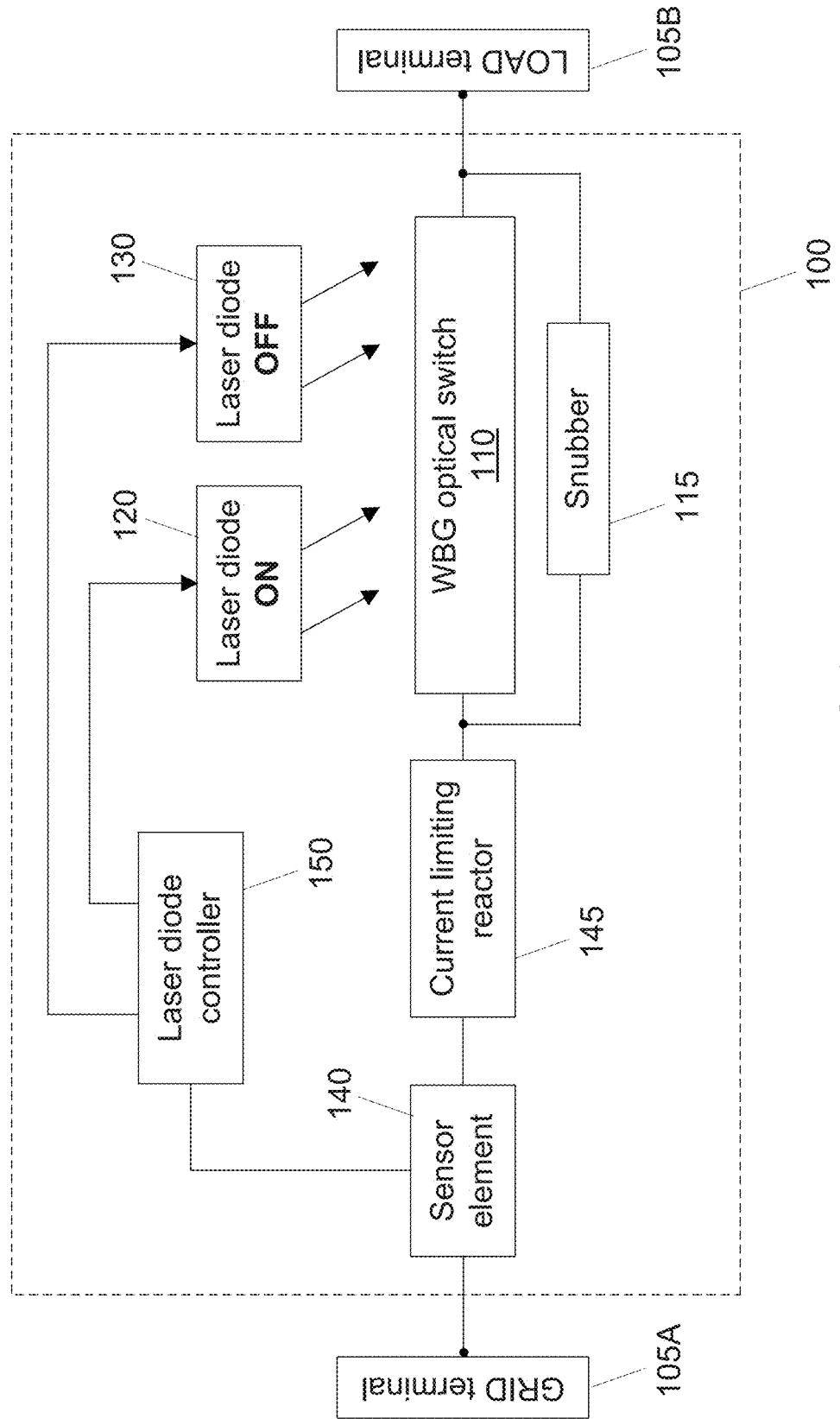
FIG. 1A illustrates an example of a circuit breaker system that includes a wide bandgap (WBG) optical switch, at least two laser sources, and control and sensing components, in accordance with the disclosed technology.
Figure 1B:
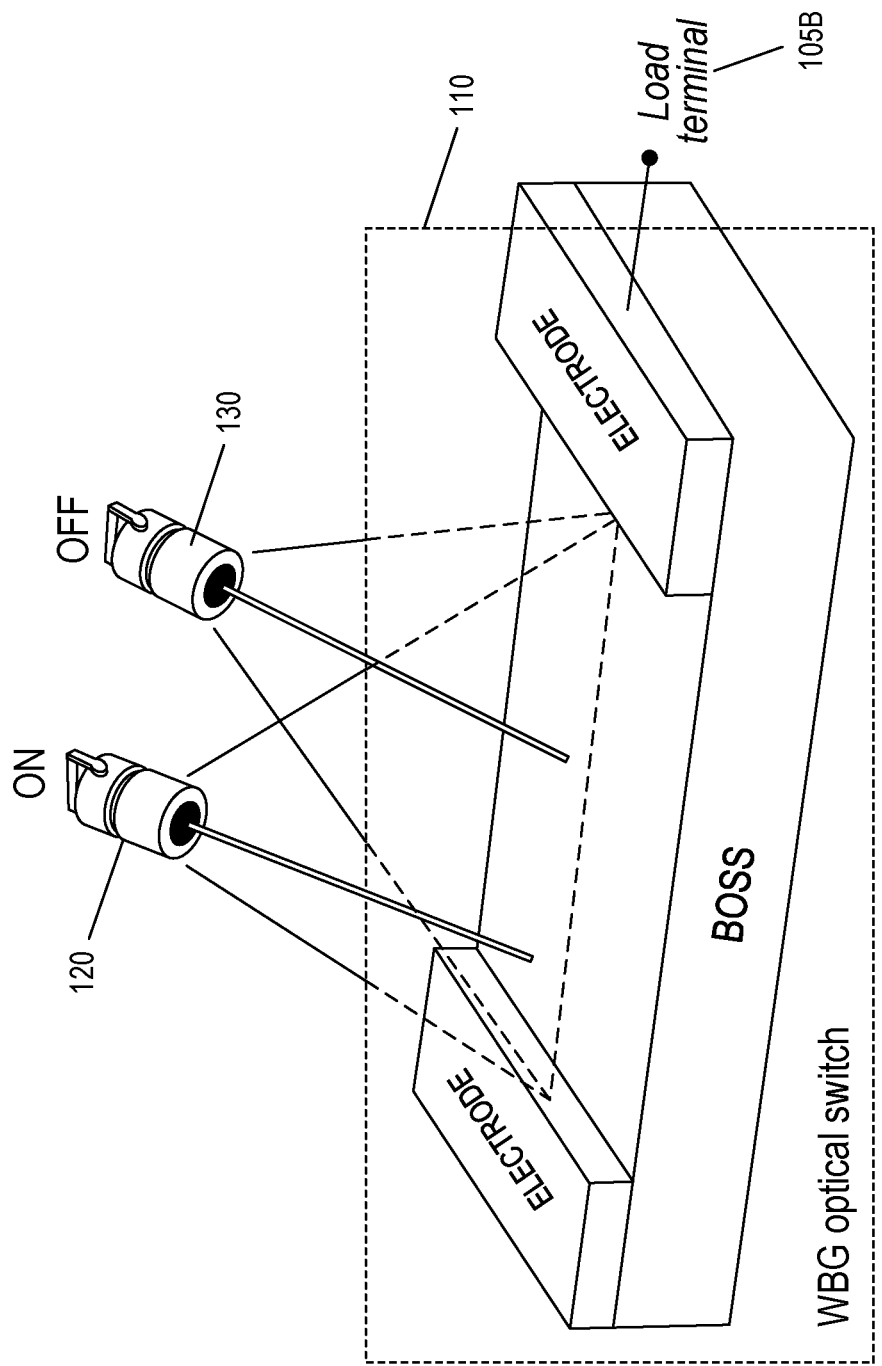
FIG. 1B illustrates an example circuit breaker configuration that includes a WBG optical switch and two laser sources in accordance with the disclosed technology.

FIGS. 1A and 1B illustrate an example of a circuit breaker system that includes a wide bandgap (WBG) optical switch that has been adapted to operate as a circuit breaker (referred to as a WBG circuit breaker in this document). As illustrated in FIG. 1A, the WBG circuit breaker (100) operates between a grid terminal (105A) and a load terminal (105B), and ensures that a fault or dangerous fluctuation in the current originating from the grid terminal (105A) does not reach the load terminal (105B).

In some embodiments, the WBG circuit breaker (100) includes the WBG optical switch (110) with a snubber (115) connected in parallel, which is used to suppress voltage transients in the circuit. The WBG optical switch (110) is coupled to a sensor (140), which is configured to detect a fault or dangerous fluctuation in the current, and a current limiting reactor (145), which is configured to reduce short-circuit currents so that the WBG optical switch can be used with a lower short circuit breaking capacity.

In some embodiments, the WBG circuit breaker (100) may operate without the current limiting reactor (145).

To close the breaker, a first sub-band gap laser source (120) (e.g., a laser diode) pulses the photo-triggered WBG optical switch (110) on through excitation of single polarity charge carriers (electrons or holes). The switch operates in avalanche mode with a prolonged lock-on effect, in which a persistent photocurrent is observed for time periods that are orders of magnitude longer than the optical pulse. In some embodiments, the lock-on time of WBG optical switch (110) can be increased further using continual or pulsed low-intensity illumination. When the sensor element (140) detects a fault, the laser diode controller (150) pulses a second laser source (130) (e.g., another laser diode) which opens the switch by exciting carriers of the opposite polarity, causing all carriers to recombine).

FIG. 1B illustrates the WBG optical switch (110) with a first laser (120), which is used to turn the switch on, and a second laser (130), which is used to turn the switch off. In some embodiments, the first laser may be further configured to provide continual or pulsed low-intensity illumination that can extend the lock-on time of the WBG optical switch (110). It is understood that it may be advantageous in some applications to provide light at a particular wavelength (e.g., 540 nanometers), in practical applications, the laser sources have a finite linewidth. Thus, the light emitted by the first laser (120) and the second laser (130) may have either a single wavelength or a small range of wavelengths.

Figure 2:
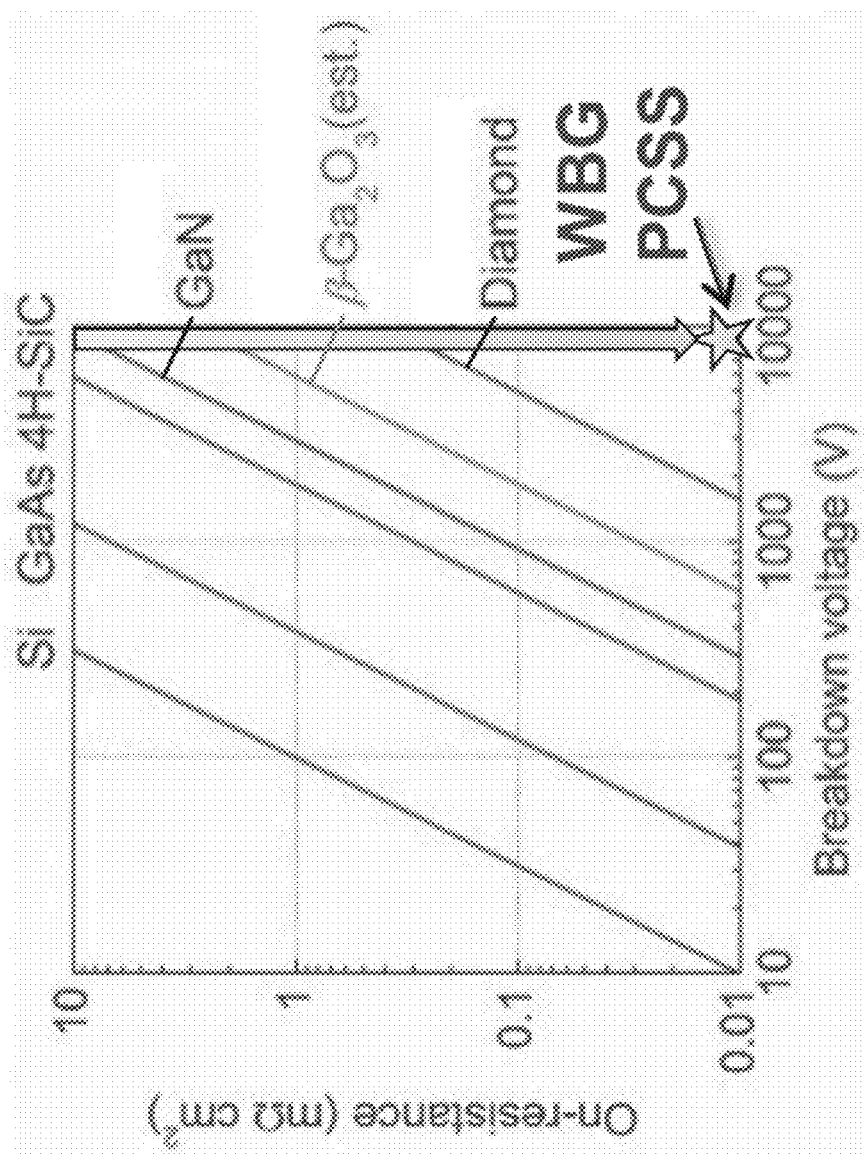
FIG. 2 is a plot that illustrates an exemplary trade-off between on-resistance and breakdown voltage for different materials.

FIG. 2 is a plot that illustrates an exemplary trade-off between on-resistance and breakdown voltage for different materials. As illustrated therein, a PCSS possess unique benefits compared to traditional junction devices, primarily due to their ability to break the traditional tradeoff between on-resistance and breakdown voltage. Because the on-resistance is controlled by photo-generated electrons and holes (generally different types of carriers), it can be made arbitrarily low for any size device. These characteristics can enable single-switch voltage-handling capabilities exceeding 30 kV with kA level current and with sub-nanosecond turn-on and turn-off times. Thus as illustrated in FIG. 2, a PCSS can be operated at high breakdown voltages while maintaining a low on-resistance value.

The embodiments described in the present document operate in a lock-on, "avalanche-like" mode. Since the amount of light required for lock-on is proportional to the thickness squared of the material, some embodiments use a wide-bandgap material, thereby enabling a smaller volume to be used for the same voltage and current handling capability, thus reducing light requirements by greater than 10×.

Figure 3:
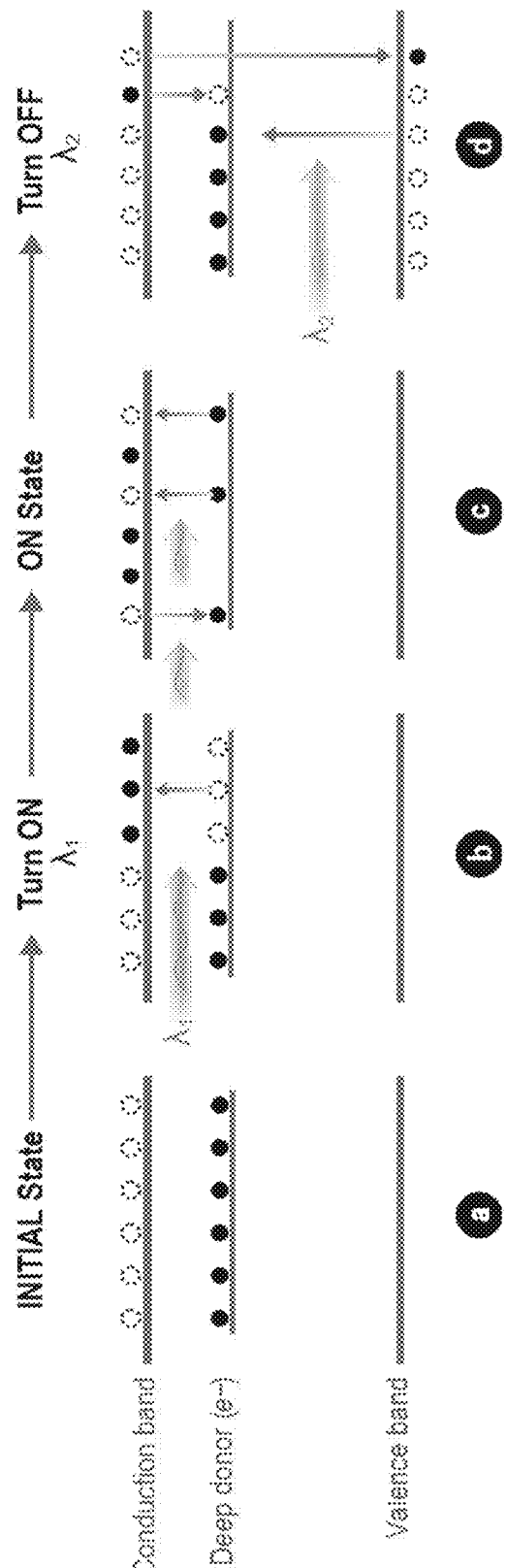
FIG. 3 is an illustration of a simplified band diagram and associated operations of a circuit breaker that includes a WBG optical , in accordance with the disclosed technology.

FIG. 3 is an illustration of a simplified band diagram for a circuit breaker that includes a WBG optical switch in accordance with the disclosed technology. For the purposes of illustration only, the WBG switch is assumed to include vanadium-doped silicon carbide.

In the initial state, SiC:V is semi-insulating with a resistivity greater than $1 \times 10^9$ $\Omega$-cm (illustrated in section (a)). An initial light pulse of wavelength $\lambda_1$ excites electrons from the deep vanadium (V) donor level (illustrated in section (b)). These electrons (or generally carriers) close the switch and, because no holes are present, the switch will remain locked on for a time determined by the time required for the electrons to recombine back into the V donor level.

This lock-on can be extended further by applying low-intensity illumination (illustrated in section (c)), such that generation and recombination of electrons from the V level are in equilibrium. When a fault is detected (or generally when a need arises to open the switch), the first light source, having a wavelength, $\lambda_1$, is turned off and a second light source, having a wavelength, $\lambda_2$, where wavelength $\lambda_2 > \lambda_1$, triggers the switch off (illustrated in section (d)) by populating the acceptor states (denoted "shallow acceptor" in FIG. 3) with electrons from the valence band, creating holes to recombine with the photo-generated electrons, thereby providing a mechanism to quickly turn the WBG optical switch off. In an example, $\lambda_1$ is 532 nm and $\lambda_2$ is 1500 nm or larger.

In some implementations of optical switches, the lock-on time is limited to the relaxation time of the photo-excited electrons back into the defect levels. In an example, while long relative to typical band-to-band recombination times in GaAs (~100 ns vs 1 ns), the relaxation time is still far short of what is required for a circuit breaker application. Therefore, the switch would need to be pulsed with light again before the lock-on time had expired, e.g., every 100 ns. Additionally or alternatively, in some embodiments the lock-on mode after the initial light pulse can be maintained by illuminating the WBG switch with a sustained laser illumination at a much lower intensity.

In this way, lock-on is maintained for hundreds of microseconds. The amount of light required for this maintenance of lock-on is significantly lower than that required to initially close the switch. In some embodiments, one or both of (i) constant, low-level illumination with a laser diode or (ii) periodic pulsing of the triggering light source while in the closed state enables precise control of the conductivity of the WBG BOSS for a particular duration, or potentially indefinite time periods.

The disclosed WBG circuit breaker can be manufactured using different materials. In one example, the WBG circuit breaker includes gallium arsenide (GaAs), whereas in another example, the WBG circuit breaker includes silicon carbide (SiC), which enables higher power, higher efficiency, and higher temperature operation compared to the GaAs BOSS. For example, the WBG circuit breaker can be implemented using SiC doped with vanadium (V) and one or more of nitrogen (N), boron (B) or aluminum (Al). Table 1 compares the relevant metrics for different implementations of the circuit breaker based on the WBG optical switch material.

TABLE 1

Comparison of relevant metrics for BOSS device materials

| Metric | Si | GaAs | SiC |
| --- | --- | --- | --- |
| Breakdown field | 0.2 MV/cm | 0.4 MV/cm | 2.5 MV/cm |
| Mobility | 1400 | 8500 | 900 |
| Carrier lifetime | Millisecond | Nanosecond | Microsecond |
| Band gap | 1.1 eV | 1.43 eV | 3.2 eV |
| Direct or indirect band gap | Indirect | Direct | Indirect |

Figure 4:
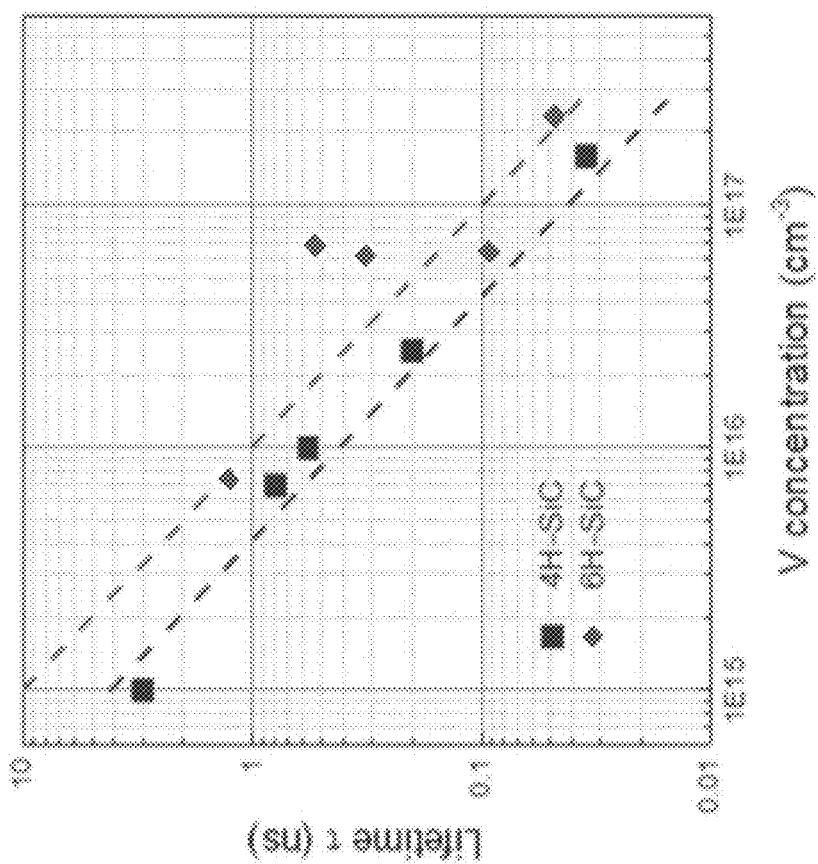
FIG. 4 is a plot that illustrates electron lifetime in vanadium-doped silicon carbide.

In particular, SiC doped with V can be readily grown in epitaxial layers and possesses the required properties for a WBG optical switch that is suitable for operation as a circuit breaker. In some examples, the level of V-doping may range from $5 \times 10^{14}$ cm$^{-3}$ to $3 \times 10^{17}$ cm$^{-3}$, with lower doping leading to longer lifetimes. The lifetime of V-doped SiC extracted by pump-probe measurements is illustrated in FIG. 4. As illustrated therein, the lifetime ($\tau$, in nanoseconds) is shown for two different polytypes of silicon carbide (4H—SiC denoted using squares, and 6H—SiC denoted using diamonds) as a function of the concentration of vanadium (the dopant, in cm$^{-3}$). Based on an extrapolation of the relationship illustrated therein, some embodiments can achieve hundreds of nanoseconds and up to microseconds of lock-on with very low V-doping.

Figure 5A:
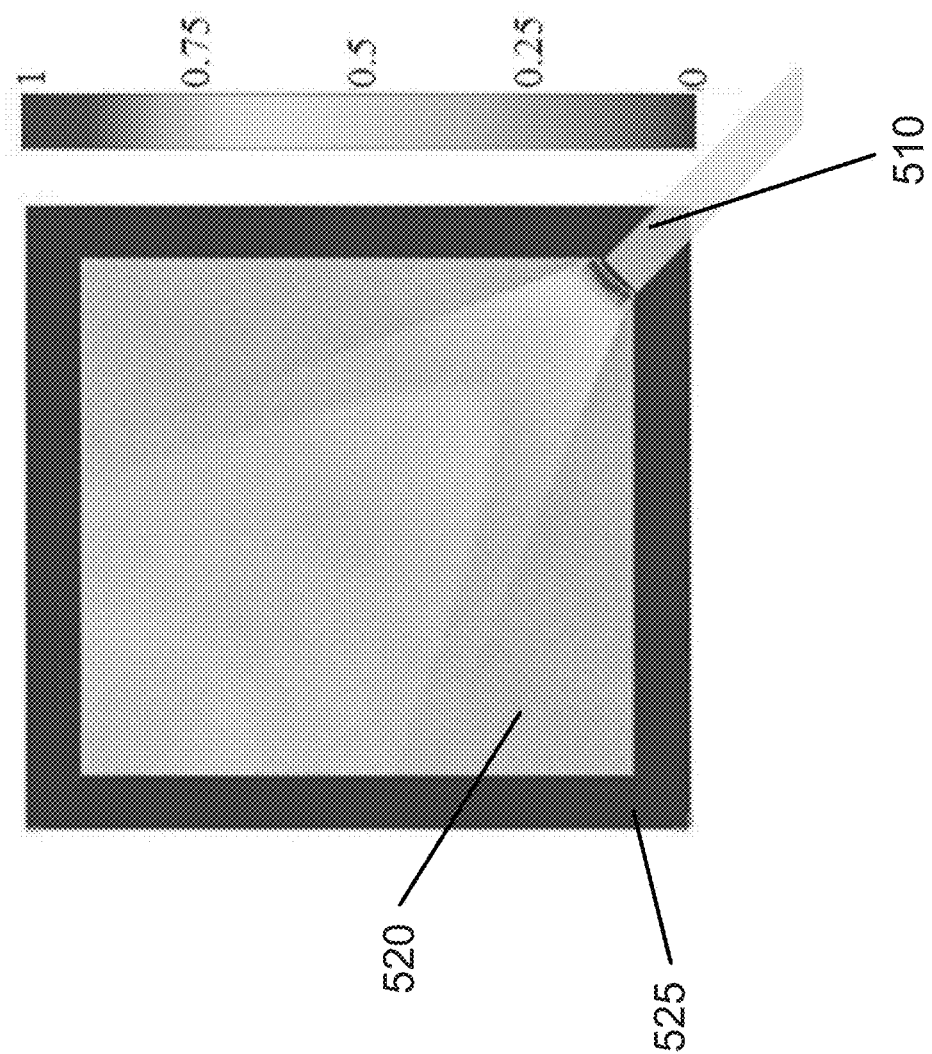
FIG. 5A illustrates an exemplary schematic of total internal reflection in the WBG optical switch.

In addition to other features and benefits, embodiments of the disclosed technology advantageously overcome the low absorption of sub-band gap light in SiC:V, which can be on the order of 1%/mm for doping levels around $5 \times 10^{16}$ cm$^{-3}$. The absorption will be even lower at the levels in the SiC WBGF circuit breaker. In some implementations, to remedy the low absorption problem, a WBG structure that utilizes total internal reflection (TIR) for a SiC:V switch can be used. Using TIR increases the light utilization to nearly 100% and can result in greater than 40× improvement in on-resistance for a given voltage and incident optical energy. FIG. 5A illustrates an exemplary schematic of total internal reflection in the WBG optical switch, wherein by introducing the light through a notch (510) in a square cavity (520) inside the surrounding material (525), nearly all of the light is trapped, which greatly improves the efficiency of the overall WBG breaker. FIG. 5B illustrates a photograph of a fabricated device of the schematic in FIG. 5A, illustrating the notch (510) and the square cavity (520).

Embodiments of the disclosed technology can cover a wide voltage range (e.g., 1-100 kV DC), and use a modular design, that can be readily scaled to other voltages. Their response time is based on a sub-microsecond phototrigger open and close, which results in opening times of nanoseconds, faster than existing implementations. Furthermore, their energy efficiency can be greater than 99.97%, which results in a reduced power loss. The capabilities of an exemplary embodiment of the WBG circuit breaker device are enumerated in Table 2.

TABLE 2

Capabilities of an exemplary WBG circuit breaker

| Category | Capability |
| --- | --- |
| Rated voltage | 1 kV DC ≤ V ≤ 100 kV DC |
| Power | ≥10 MW |
| Efficiency | ≥99.97% |
| Response time | ≤1 μs |
| Lifetime | ≥30,000 cycles, ≥ 30 years |
| Nuisance trips | <0.1% |
| Power density | 1 GW/m$^3$ |
| Cooling | Passive or forced air |

In an example, the efficiency of a circuit breaker based on the embodiments described herein can be calculated as follows. For a 1MW distribution line, operating at 100 kV, the current in the line is 10 A. For 99.97 percent efficiency in the closed state, the breaker can dissipate, at most, 300 W total, which corresponds to an effective on-resistance of 3 ohms. Embodiments of the disclosed technology can be built on a modularly scalable 2-ohm, 20 kV unit, and may include 25 BOSS devices—5 parallel combinations of 5×20 kV units in series. Each device can, for example, operate using 10 nJ of optical energy pulsed every 10 microseconds. Laser diodes are approximately 40% efficient at converting electrical power to optical power, which means total electrical power required to drive the circuit breaker in the on state is 50 mW. The total power dissipated is then 200.05 W for an effective efficiency of 99.98%. Thus, each switch will dissipate 8 W, which is easily removed by passive cooling.

Embodiments of the disclosed technology include a wide bandgap optical switch, a first laser operable at a first wavelength or range of wavelengths, a second laser operable at a second wavelength or range of wavelengths, and a laser controller circuit configured to produce electronic signals for operation of the first laser and the second laser, wherein the first laser is coupled to the laser controller circuit and configured to illuminate the wide bandgap optical switch in response to receiving a first signal from the laser controller and to thereby cause a sustained current to flow through the wide bandgap optical switch and to thereby cause the optical circuit breaker device to close, wherein the second laser is coupled to the laser controller circuit and configured to illuminate the wide bandgap optical switch with light having the second wavelength or range of wavelengths in response to a second signal, and to thereby cause the optical circuit breaker device to open, and wherein the first wavelength or range of wavelengths is different from the second wavelength or range of wavelengths.

In some embodiments, the second wavelength or the second range of wavelengths is higher than the first wavelength or the first range of wavelengths, respectively. For example, the first wavelength or range of wavelengths spans 520-560 nm, and wherein the second wavelength or range of wavelengths spans 635-700 nm.

In some embodiments, illumination by the first laser triggers excitation of either electrons or holes in a wide bandgap material that cause the current flow, and illumination by the second laser triggers excitation of the other carriers (e.g. holes if electrons are already present) in the wide bandgap material of the wide bandgap switch that enables recombination of the previously generated electrons, thereby stopping (or substantially restricting) the current flow.

In some embodiments, the first laser is configured to turn off or otherwise not illuminate the wide bandgap optical switch in response to the second signal.

In some embodiments, the WBG optical switch-based circuit breaker further includes a sensor coupled to the laser controller circuit, wherein the sensor is configured to sense a fault condition in response to which the laser controller is configured to generate the second signal.

In some embodiments, the laser controller is configured to cause the first laser to illuminate the wide bandgap switch with an initial light pulse with a first average intensity for a first duration of time, and to illuminate the wide bandgap switch with a light pulse with a second average intensity that is smaller than the first average intensity to enable the sustained current to flow through the wide bandgap optical switch. In an example, the light pulse with the second average intensity is a continuous wave pulse. In another example, the light pulse with the second average intensity is a modulated light pulse.

In some embodiments, the wide bandgap optical switch comprises a doped silicon carbide (SiC) material. In an example, the doped SiC material includes a vanadium (V) and may include one or more of nitrogen (N), boron (B) or aluminum (Al), and a level of the dopant in the silicon carbide ranges from $5\times10^{14}$ cm$^{-3}$ to $3\times10^{17}$ cm$^{-3}$.

In some embodiments, the wide bandgap optical switch comprises one or a copper-doped gallium arsenide (GaAs:Cu) or an iron-doped gallium nitride (GaN:Fe).

Embodiments of the disclosed technology include a first electrode configured to receive a current from a load terminal, a second electrode that is spaced apart from the first electrode and configured to transmit the current to a grid terminal, and a region of wide bandgap semiconducting material that occupies at least a portion of the space between the first and second electrodes, wherein the region of wide bandgap semiconducting material is configured to operate in an avalanche mode upon incidence of a light pulse with a first wavelength or range of wavelengths, thereby allowing the current to flow therethrough without substantial absorption of the current, and operate in a current-limiting mode upon incidence of a light pulse with a second wavelength of range of wavelengths that is different from the first wavelength or range of wavelengths, thereby substantially restricting propagation of the current therethrough.

Figure 6:
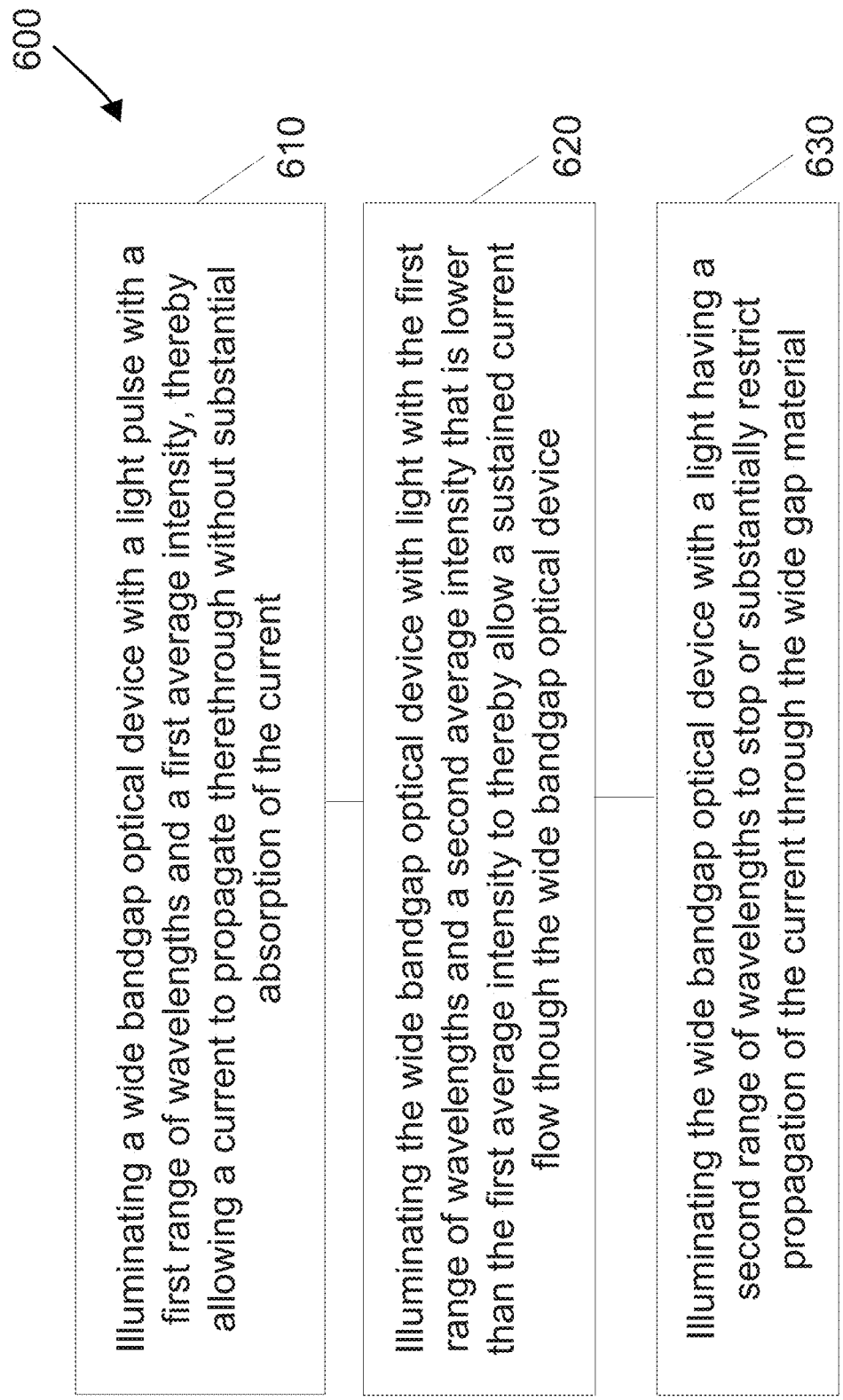
FIG. 6 illustrates an exemplary method of operating the WBG optical switch.

FIG. 6 is a flowchart of an example method of operating a WBG optical switch. The method 600 includes, at operation 610, illuminating the wide bandgap optical device with a light within a first range of wavelengths and a first average intensity, thereby allowing a current to propagate therethrough without substantial absorption of the current.

The method 600 includes, at operation 620, illuminating the wide bandgap optical device with light within the first range of wavelengths and a second average intensity that is lower than the first average intensity to allow a sustained current flow though the wide bandgap optical device.

The method 600 includes, at operation 630, illuminating the wide bandgap optical device with light within a second range of wavelengths to stop or substantially restrict propagation of the current through the wide gap material.

In some embodiments, wherein, prior to illuminating the wide bandgap optical device with the light within the second range of wavelengths, the method 600 further includes the operation of receiving an indication of a detection of a fault in a circuit comprising the wide bandgap optical device, wherein in response to receiving the indication, the wide bandgap optical device is illuminated with the light within the second range of wavelengths.

In some embodiments, the light within the first range of wavelengths and having the second average intensity includes a plurality of pulses.

In some embodiments, the light within the first range of wavelengths and having the second average intensity includes a continuous wave.

In some embodiments, the second range of wavelengths is greater than the first range of wavelengths.

In some embodiments, the wide bandgap optical device comprises a doped silicon carbide (SiC) material. In an example, the doped SiC material includes a dopant comprising vanadium (V) and one or more of nitrogen (N), boron (B) or aluminum (Al), and a level of the dopant in the silicon carbide ranges from $5\times10^{14}$ cm$^{-3}$ to $3\times10^{17}$ cm$^{-3}$.

In some embodiments, the wide bandgap optical device comprises one of copped-doped gallium arsenide (GaAs:Cu) or iron-doped gallium nitride (GaN:Fe).

In some embodiments, the first range of wavelengths spans 520-560 nm, and wherein the second range of wavelengths spans 635-700 nm.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:
1. An optical circuit breaker device, comprising:
a wide bandgap optical switch;
a first laser operable at a first wavelength or range of wavelengths;
a second laser operable at a second wavelength or range of wavelengths; and a laser controller circuit configured to produce electronic signals for operation of the first laser and the second laser, wherein the first laser is coupled to the laser controller circuit and configured to illuminate the wide bandgap optical switch in response to receiving a first signal from the laser controller and to thereby cause a sustained current to flow through the wide bandgap optical switch and to cause the optical circuit breaker device to close, wherein the second laser is coupled to the laser controller circuit and configured to illuminate the wide bandgap optical switch with light having the second wavelength or range of wavelengths in response to a second signal, and to thereby cause the optical circuit breaker device to open, wherein the first wavelength or range of wavelengths is different from the second wavelength or range of wavelengths, and wherein the laser controller is configured to cause the first laser to illuminate the wide bandgap switch with an initial light pulse with a first average intensity for a first duration of time, and to illuminate the wide bandgap switch with a light pulse with a second average intensity that is smaller than the first average intensity to enable the sustained current to flow through the wide bandgap optical switch.

2. The optical circuit breaker device of claim 1, wherein the second wavelength or the second range of wavelengths is higher than the first wavelength or the first range of wavelengths, respectively.

3. The optical circuit breaker device of claim 1, wherein illumination by the first laser triggers a generation of charge carriers with a first polarity in a wide bandgap material of the wide bandgap switch that causes the current flow.

4. The optical circuit breaker device of claim 3, wherein illumination by the second laser triggers a generation of charge carriers with a second polarity opposite to the first polarity in the wide bandgap material of the wide bandgap switch which results in substantially restricting or stopping the current flow.

5. The optical circuit breaker device of claim 1, wherein the first laser is configured to turn off or otherwise not illuminate the wide bandgap optical switch in response to the second signal.

6. The optical circuit breaker device of claim 1, further comprising a sensor coupled to the laser controller circuit, wherein the sensor is configured to sense a fault condition in response to which the laser controller is configured to generate the second signal.

7. The optical circuit breaker device of claim 1, wherein the light pulse with the second average intensity is a continuous wave pulse.

8. The optical circuit breaker device of claim 1, wherein the light pulse with the second average intensity is a modulated light pulse.

9. The optical circuit breaker device of claim 1, wherein the wide bandgap optical switch comprises a doped silicon carbide (SiC) material.

10. The optical circuit breaker device of claim 9, wherein the doped SiC material includes a dopant comprising vanadium (V) and one or more of nitrogen (N), boron (B), or aluminum (Al).

11. The optical circuit breaker device of claim 10, wherein a level of the dopant in the silicon carbide ranges from $5 \times 10^{14}$ cm$^{-3}$ to $3 \times 10^{17}$ cm$^{-3}$.

12. The optical circuit breaker device of claim 1, wherein the first range of wavelengths spans 520-560 nm, and wherein the second range of wavelengths spans 635-700 nm.

* * * * *